(12) United States Patent
Tanaka

(10) Patent No.: US 7,413,978 B2
(45) Date of Patent: Aug. 19, 2008

(54) SUBSTRATE, ELECTRO-OPTICAL DEVICE, ELECTRONIC APPARATUS, METHOD OF FORMING SUBSTRATE, METHOD OF FORMING ELECTRO-OPTICAL DEVICE, AND METHOD OF FORMING ELECTRONIC APPARATUS

(75) Inventor: Hideki Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 333 days.

(21) Appl. No.: 11/176,248

(22) Filed: Jul. 8, 2005

(65) Prior Publication Data
US 2006/0043592 A1    Mar. 2, 2006

(30) Foreign Application Priority Data
Aug. 31, 2004    (JP)    ............................ 2004-252326

(51) Int. Cl.
 H01L 21/44 (2006.01)
 H01L 23/52 (2006.01)
 H01L 23/48 (2006.01)
 H01L 23/40 (2006.01)
 H01L 21/768 (2006.01)

(52) U.S. Cl. .................. 438/667; 438/668; 257/774; 257/758; 257/759; 257/E21.585; 257/E21.586

(58) Field of Classification Search ................ 438/667, 438/668; 257/774, 758, 759, E21.585, E21.586
See application file for complete search history.

(56) References Cited

U.S. PATENT DOCUMENTS 6,476,503 B1 * 11/2002 Imamura et al. ............ 257/780
2003/0082906 A1   5/2003 Lammert
2005/0026421 A1 * 2/2005 Tanaka et al. ............... 438/622

FOREIGN PATENT DOCUMENTS

JP        A 2003-179139        6/2003

* cited by examiner

Primary Examiner—Luan Thai
(74) Attorney, Agent, or Firm—Oliff & Berridge, PLC

(57) ABSTRACT

A contact structure, including: a first conductive layer; a insulating layer formed on the first conductive layer; a second conductive layer formed on the insulating layer; and a columnar structure, buried in a direction of film thickness in the insulating layer, electrically connecting the first conductive layer and the second conductive layer; wherein a reinforcement material is adhered to a vicinity of a root of the columnar structure.

14 Claims, 7 Drawing Sheets

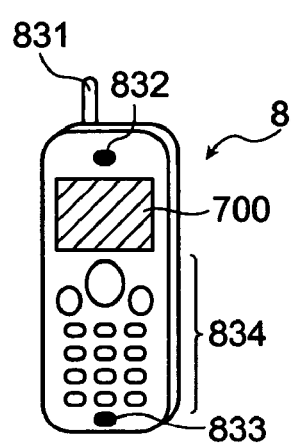
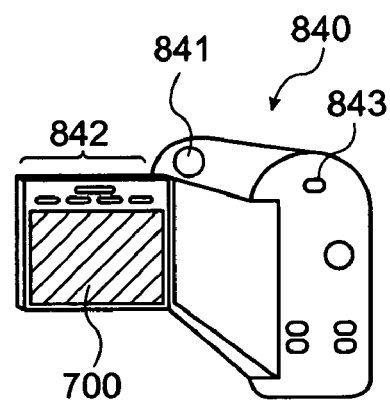
FIG. 7A          FIG. 7B
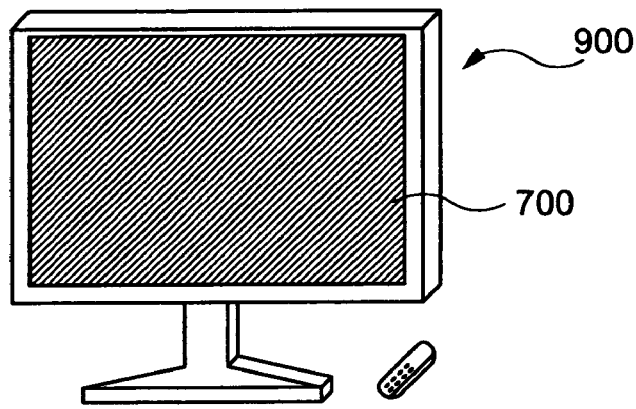
FIG. 7C
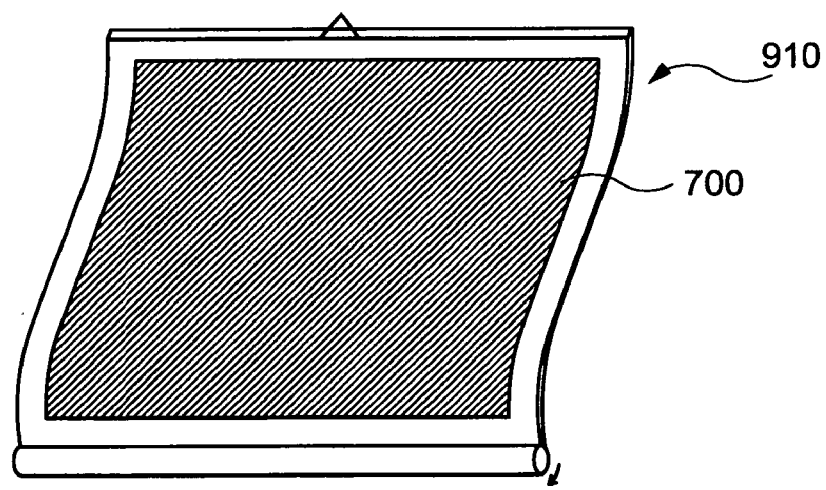
FIG. 7D

SUBSTRATE, ELECTRO-OPTICAL DEVICE, ELECTRONIC APPARATUS, METHOD OF FORMING SUBSTRATE, METHOD OF FORMING ELECTRO-OPTICAL DEVICE, AND METHOD OF FORMING ELECTRONIC APPARATUS

BACKGROUND

The present invention relates to a microstructure and a manufacturing method thereof.

Common techniques of forming a contact structure, in order to achieve electric connections of multi-layered wirings or wirings between semiconductor devices, are described, for instance, in Japanese Unexamined Patent Publication No. 2003-179139.

As disclosed in the example, a method for obtaining a contact structure includes: forming a plated strut by metal plating on a metallic layer, thereafter coating on the metallic layer and the plated strut with a polymer. Moreover, as disclosed in another embodiment in the example, a method for obtaining a contact structure includes: forming a strut with a photoresist on a metallic layer, thereafter coating the metallic layer and the plated strut with a polymer, followed by filling a hole formed by removing a photoresist with a metallic material.

However, the above-mentioned methods involve a problem of struts falling if coated with the polymer in a high-speed condition such as with spin coating etc., in the case struts have a high aspect ratio, causing product yield to decrease.

SUMMARY

An advantage of the invention is to provide: a contact structure, which can be manufactured with a high yield and is suitable for mass production, even in case of forming struts with a high aspect ratio; and a method for manufacturing the contact structure as well as a method for manufacturing a microstructure.

According to a first aspect of the invention, a contact structure includes: a first conductive layer; an insulating layer formed on the first conductive layer; a second conductive layer formed on the insulating layer; and a columnar structure, buried in a direction of film thickness in the insulating layer, electrically connecting the first conductive layer and the second conductive layer; wherein a reinforcement material is adhered to a vicinity of a root of the columnar structure.

As described, the reinforcing material is adhered to the vicinity of the columnar structure's foot, thereby reinforcing the columnar structure; hence leaning of the columnar structure can be avoided, in the case of depositing a film-forming material in the high-speed condition such as in the spin coating etc., upon manufacturing the contact structure. Consequently, the contact structure, in which a reliable electric connection between the first and the second conductive layers, can be provided.

In this case, the reinforcement material may adhere to a periphery of a connecting part between the columnar structure and the first conductive layer, and thereby the columnar structure and the first conductive layer may be fixed. Further, in the case where the first conductive layer is provided on a base material or in the base material, the reinforcement material may also adhere to an area including a periphery of a connecting part between the columnar structure and the first conductive layer, and thereby the columnar structure and the base material may be fixed. Consequently, the electric connection between the first and the second conductive layers can further be secured.

The reinforcement material may be composed with a dielectric material or may also be composed with a conductive material. Generally, in the connecting parts between a conductive layer and a columnar structure, heat generation and disconnection tend to occur, due to a decrease of a wire's sectional area (the columnar structure's sectional area) caused by the electromigration. However, if the reinforcing material is composed with a conductive material, such heat generation and the disconnection may be reduced.

According to a second aspect of the invention, a method for manufacturing a microstructure, having a layer in which a fine columnar structure is buried in a direction of film thickness, the method for manufacturing the microstructure includes: forming the columnar structure on a base material; adhering a reinforcement material to a vicinity of a root of the columnar structure, and fixing the columnar structure; and depositing a film-forming material on the base material, on which the columnar structure is fixed to.

As described, the vicinity of the columnar structure's foot is fixed by the reinforcing material; hence occurrence of defects caused by the falling of the columnar structures can be reduced, in the case of depositing a film-forming material in the high-speed condition such as in the spin coating etc. Consequently, a mass production of the microstructures is possible with a high yield. For instance, a semiconductor device or a multi-layer wiring etc., having a contact structure in order to achieve the electric connections between wiring layers, are examples of such microstructures.

The area, on which the reinforcing material is adhered, is not limited specifically. It may also be spread across a plurality of the columnar structures. Moreover, the reinforcing material may also be formed thicker than the insulating layer, in the direction of the insulating layer thickness. For instance, the diameter of an undersurface in the area, on which the reinforcing material is adhered, is three times or more larger than the columnar structure's diameter, desirably 3 to 6 times, and the height thereof is three times or more larger than the columnar structure's diameter, desirably 3 to 6 times. If the size of the area, on which the reinforcing material is adhered, is at least the certain minimum value mentioned above, then the columnar structure tends to be stabilized. Further, setting the size of the area, on which the reinforcing material is adhered, to a suitable range mentioned above, enables the columnar structure's stabilization, without using more than a necessary quantity of the reinforcement material. Still further, the reinforcement material can be adhered in a shape schematically having any of a triangular-like, a semicircle-like, or a quadrangular-like shape.

The reinforcement material can be adhered with, for instance, a droplet discharge device (so-called "inkjet device"). With such device, it is possible to adhere the reinforcement material to an appropriate location; thus avoiding the wastage of the material.

According to a third aspect of the invention, a method for manufacturing a contact structure includes the steps of: (a) forming a fine columnar structure on a first conductive layer; (b) externally adhering a reinforcement material on a vicinity of a foot of the columnar structure, and fixing the columnar structure; and (c) forming a insulating layer on the first conductive layer to which the columnar structure is fixed, so that a tip end part of the columnar structure is exposed.

As described, the columnar structure is fixed by the reinforcing material; hence occurrence of defects caused by the falling of the columnar structures can be reduced, in the case of forming the insulating layer on the base material that includes the columnar structure. Moreover, the columnar structures are fixed by an external adherence of the reinforcement material, allowing them to be fixed in a simple process. Consequently, the mass production of products with the microstructures is possible with a high yield.

It is desirable that the columnar structure be composed with the conductive material, and that subsequently to the third process, the forth process, of forming the second conductive layer in order for it to have a contact with the tip end part of the columnar structure, be included. That is to say, forming the columnar structures by the conductive material enables the contact structure to be formed directly, by forming the second conductive layer in order for it to have the contacts with the columnar structures, hence allowing the contact structure to be formed in a simple process.

In this case, it is desirable that the reinforcement material be composed with the dielectric material. Consequently, the reinforcement material can be a part of the insulating layer, allowing the reinforcement without changing the size of the columnar structure, thus providing a high-density wiring.

In contrast to the above, it is also desirable in this case that the reinforcement material be composed with the conductive material. With such configuration, the reinforcement material and the columnar structures are combined, and the contact area between the columnar structure and the first conductive layer grows larger; therefore a reliable electric connection can be provided and an alignment precision can be lessened.

It is desirable that the method for manufacturing the contact structure further include a step (e), in which a lyophilic processing is performed at least at the vicinity of the foot of the columnar structure, after the step of forming the columnar structure. Consequently, the conductive material can be securely adhered to the vicinity of the columnar structure's root.

It is desirable that the step (e) be a process for forming a self assembled mono layer at least at the vicinity of the foot of the columnar structure. Therefore, the lyophilic processing can easily be performed on the columnar structure.

Additionally, the lyophilic processing can also be conducted by roughening the surface of the columnar structure by laser beam radiation, for instance by an UV radiation etc.

It is desirable that the method for manufacturing the contact structure further comprise, after the step (c), the steps of: (f) filling a conductive material to a space formed after removing the columnar structure; (g) patterning the conductive material; and (h) forming the second conductive layer so that it has a contact with the conductive material.

This broadens the selection of materials for forming the columnar structure, since the material used for the columnar structure that serves as a frame for forming a contact hole, and a material for filling the contact hole, in other words, the material for forming a contact plug with, can be different. Further, the conductive material composing the contact plug and the formation method thereof are not limited to materials and formation methods with which the columnar structure can easily be formed. It can be any material and a formation method thereof suitable for electric connection. Hence a further high performance of the structure can be provided.

It is desirable that the columnar structure be composed with a material with a different etching rate than that of the insulating layer, and that the columnar structure be removed with etching. This makes it possible to form the contact hole easily.

In this case, the material with a different etching rate than that of the insulating layer may be a photoresist. This makes it possible to form the contact hole easily.

In this case, the reinforcement material may be composed with the photoresist. Consequently, the reinforcement material can be removed simultaneously with the removal of the columnar structure. With such configuration, the contact plug enlarged at the vicinity of its foot is formed; therefore a reliable electric connection with the first conductive layer can be provided, and an alignment precision can be lessened.

In this case, it is desirable that the reinforcement material be composed with the dielectric material. Consequently, the reinforcement material can be a part of the insulating layer, allowing the reinforcement without changing the size of the columnar structure itself; thus providing a high-density wiring.

It is preferable for a semiconductor device to include the contact structure manufactured using the method for manufacturing the above-mentioned contact structure. Consequently, by utilizing the above-mentioned method for manufacturing the contact structure, the semiconductor device having the above-mentioned contact structure can be provided in low cost.

It is preferable for a multi-layered wiring to include the contact structure manufactured using the above-mentioned method for manufacturing the contact structure. Consequently, by utilizing the above-mentioned method for manufacturing the contact structure, the multi-layered wiring having the above-mentioned contact structure can be provided with low cost.

It is preferable for an electronic appliance to include the semiconductor device and/or the multi-layered wiring described above. Consequently, the electronic apparatus composed with the semiconductor device and/or the multi-layered wiring described above can be provided in low cost.

BRIEF DESCRIPTION OF THE DRAWINGS

The invention will be described with reference to the accompanying drawings, wherein like numbers refer to like elements, and wherein:

FIG. 7 includes drawings showing examples of various electronic apparatus configured including an electro-optical device.

DETAILED DESCRIPTION OF EMBODIMENTS

Embodiments of the invention will now be described, with reference to drawings.

Embodiments of the invention include a method for manufacturing a microstructure, having a layer in which a fine columnar structure is buried in a direction of film thickness, the method for manufacturing the microstructure including: forming of the columnar structure on a base material; and fixing of the vicinity of the root of the columnar structure with a reinforcement material, upon burying the columnar structure in a layer composed with an organic material such as a resin or with a mineral material such as an oxide silicon. Therefore, an occurrence of defects caused by the fall of the columnar structure can be reduced, and a mass production of the microstructures is possible with a high yield, in the case of depositing a film-forming material in a high-speed condition such as with spin coating etc.

There is no specific limitation for defining such microstructures. For instance, a semiconductor device or a multilayer wiring etc., having a contact structure in order to achieve the electric connections between wiring layers, are examples of such micro structures.

There is no specific limitation in a method for adhering the reinforcement material, as long as the reinforcement material is applied in a desired location. For instance, the reinforcement material can be adhered with a droplet discharge device (so-called "inkjet device"). With such a device, it is possible to adhere the reinforcement material to an appropriate location; thus avoiding the wastage of the material.

Figure 1:
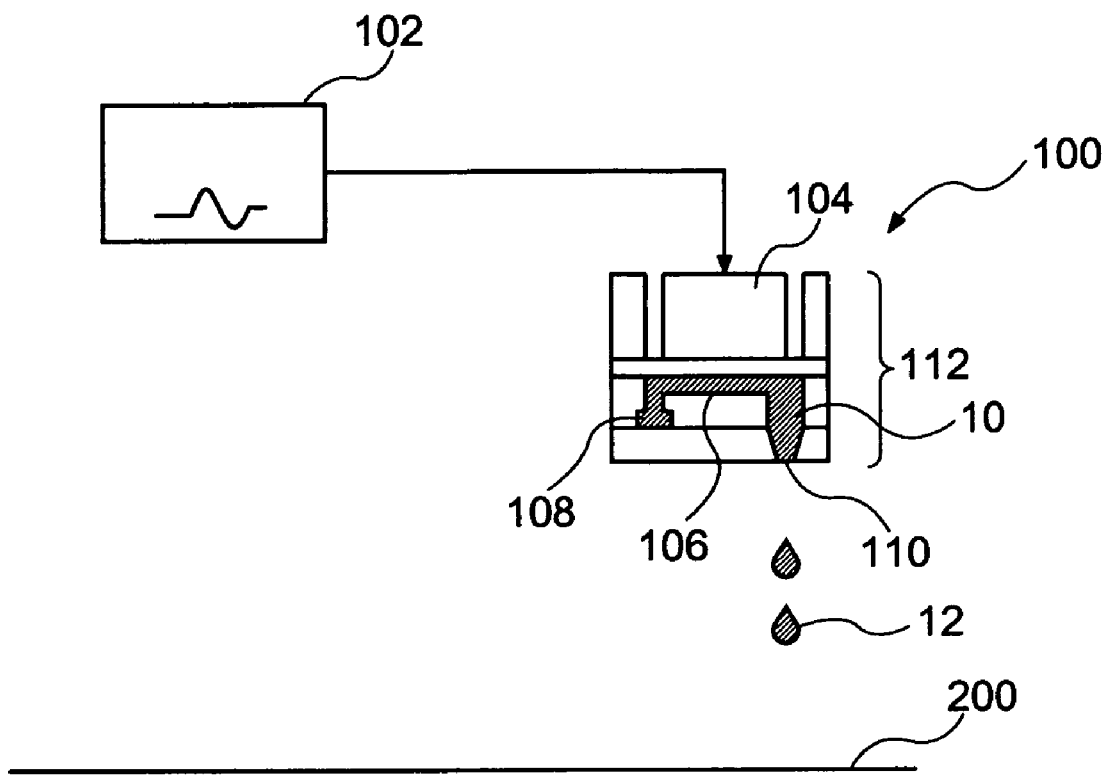
FIG. 1 is a drawing showing an example of a configuration of an inkjet head used in embodiments of the invention.
Figure 2A:
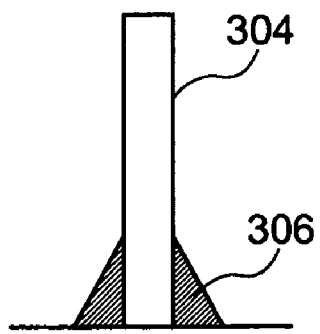
FIG. 2 includes drawings showing examples of schematic shapes of a reinforcement material adhered.
Figure 2B:
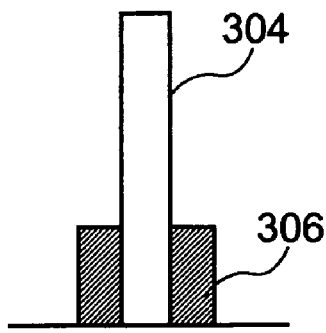
Figure 2C:
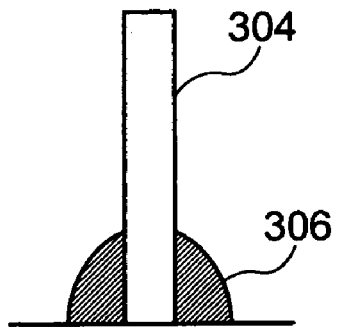
Figure 2D:
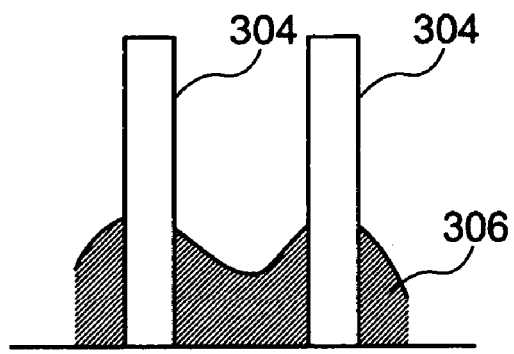
Figure 2E:
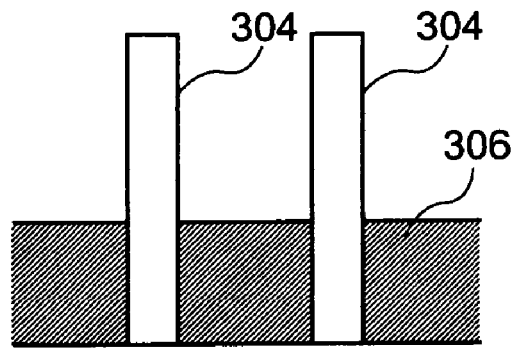

FIG. 1 is a drawing showing an example of a configuration of an inkjet head 100 (hereafter also referred to as "droplet discharge head") used in the embodiments of the invention. The inkjet head 100 discharges a droplet 12 composed with a liquid material 10 that includes the reinforcement material, from a nozzle 110 toward a substrate 200, with the droplet discharge method (so-called inkjet method).

In a body 112 of the inkjet head 100, a reservoir 108 and a plurality of pressuring chambers 106, branching from the reservoir 108, are formed. The reservoir 108 is a channel for supplying the liquid material 10 to each of the pressuring chambers 106. Moreover, on an undersurface of the body 112 of the head, a nozzle plate, which composes a discharge surface, is mounted, and on the nozzle plate, a plurality of nozzles 110 that discharge the liquid material 10 is opened corresponding to each pressuring chamber 106. A piezo element 104 has a piezoelectric material, such as crystal etc., held by a narrow pair of electrodes (not shown), and the pair of electrodes is connected to a driving circuit 102.

Here, if the driving circuit 102 applies voltage to the piezo element 104, the piezo element 104 undergoes an expansion deformation or contraction deformation. If the piezo element 104 undergoes the contraction deformation, the pressure in the pressuring chamber 106 decreases and the liquid material 10 flows from the reservoir 108 into the pressuring chamber 106, while if the piezo element 104 undergoes the expansion deformation, the pressure in the pressuring chamber 106 increases and the liquid material 10 is discharged from the nozzle 110.

In the above example, the case in which the piezo element 104 is used as a driving method of the inkjet head 100 is described. However, the driving method may also include an electro-statically driven method, a thermal inkjet method or the like.

The size of the area, on which the reinforcing material is adhered, is not limited specifically as long as it is large enough so as to have an ability to support the columnar structure at the time of the insulating layer formation. Therefore, the size of the area, on which the reinforcing material is adhered, is modified appropriately according to an aspect ratio of the columnar structure, a formation condition of the insulating layer, an adhesiveness of the columnar structure and the reinforcement material, and an adhesiveness of the substrate and the reinforcement material, etc. As a reference, for example, the diameter of an undersurface in the area, on which the reinforcing material is adhered, is three times or more larger than the columnar structure's diameter, desirably 3 to 6 times, and the height thereof is three times or more larger than the columnar structure's diameter, desirably 3 to 6 times. If the size of the area, on which the reinforcing material is adhered, is at least the certain minimum value mentioned above, then the columnar structure tends to be stabilized. Further, setting the size of the area, on which the reinforcing material is adhered, to the suitable range mentioned above, enables the columnar structure's stabilization, without using more than the necessary quantity of the reinforcement material.

Further, the schematic shape of the adhered reinforcement material is not specifically limited, and can be adhered, for instance, in any one of a triangular-like, a semicircle-like, or a quadrangular-like shape. Still further, in the case where the plurality of columnar structures stands close to each other, the reinforcement material for the adjacent columnar structure may also be formed in a series. In FIG. 2, examples of schematic shapes of a reinforcement material adhered are shown. A numeral 304 in FIG. 2 represents a columnar structure, and a numeral 306 represents a reinforcement material.

Hereafter, methods for forming a contact structure in the embodiments of the present invention are described using the above-mentioned inkjet head 100 as an example.

Embodiment 1

FIG. 3 is a drawing for explaining a method of manufacturing the contact structure in Embodiment 1.

Figure 3A:
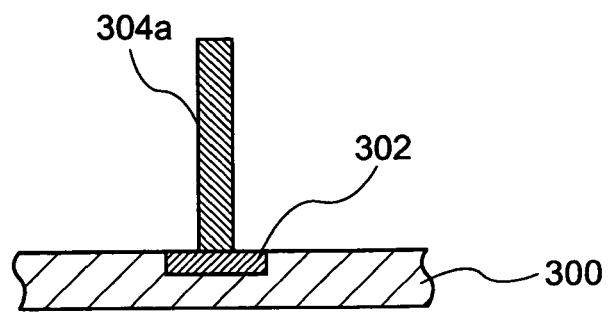
FIG. 3 is a drawing for explaining a method of manufacturing a contact structure in Embodiment 1.

As shown in FIG. 3A, a fine columnar structure 304a, composed of a conductive material, is formed on a first conductive layer 302 that is composed of, for instance, Tungsten etc., which is formed on a substrate 300 that serves as a base material (for instance, Si substrate).

More specifically, a plating seed layer (for instance, a copper thin film)(not shown) is formed on the first conductive layer 302 by sputtering or by a vapor deposition etc., and on it, a photoresist layer is formed. Thereafter, a resistive pattern is formed by conducting exposure and lithography, so that a concave portion is formed at the desired location, on which the columnar structure is formed. Plating is performed on the plating seed layer that is exposed inside the concave portion, using, for instance, a copper sulfate liquid solution, and Cu is deposited; hence the columnar structure 304a is obtained.

A forming method of the columnar structure 304a is not limited to the above. The columnar structure 304a may also be formed, for instance, by performing the following: forming, in advance, a layer composed of the conductive material such as metals etc., by sputtering or by vapor deposition; and thereafter performing patterning and etching using a photolithographic technique. Moreover, the columnar structure 304a may also be formed utilizing screen-printing or the like, by printing and firing a conductive paste from metals (for instance, Au) etc.

Figure 3B:
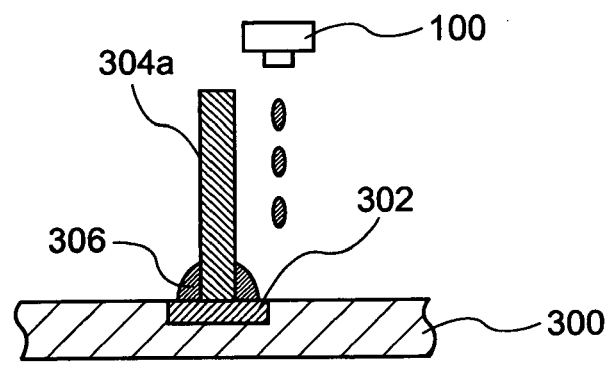

As shown in FIG. 3B, the reinforcement material 306 is adhered to the vicinity of the columnar structure 304a's foot, using the above-mentioned inkjet head 100, thereby fixing the columnar structure 304a.

The reinforcement material 306 is supplied to the vicinity of the columnar structure 304a's foot, particularly so as to fix the adhering peripheral of the columnar structure 304a and the first conductive layer 302.

Materials for the reinforcement material 306 may include, for example, the conductive material, specifically the same kind of material used for a insulating layerinsulating layer 308 deposited on a peripheral of the columnar structure 304a in a later process. Consequently, the reinforcement material 306 can be a part of the insulating layerinsulating layer 308, allowing the reinforcement without changing the size of the columnar structure itself; thus providing a high-density wiring. Further, the conductive material, specifically the same kind of material used to compose the columnar structure 304a may also be used as a material for the reinforcement material 306. With such configuration, since the contact area of the columnar structure 304a and the first conductive layer grows larger, a reliable electric connection can be provided and an alignment precision of the columnar structure 304a and the first conducive layer can be lessened.

Liquid for dispersing or dissolving the reinforcement material 306 is not specifically limited and may be any kind of liquid such as water, organic solvent (for instance, alcohol) or the like. More specifically, the material is selected appropriately according to the characteristics of the reinforcement material 306 as a dispersoid or solute, a drying condition, a coating method, etc. For example, in the case where a polysilazane, formed in a low firing temperature, is used for the reinforcement material 306, xylene or dibutyl ether may be used for the liquid.

After adhering the droplet that includes the reinforcement material 306 to a desired location, the droplet is dried and the columnar structure 304a is fixed. At this point, the firing may also be performed accordingly. For instance, the firing is performed for 30 to 120 minutes at 300 to 450 degrees Celsius, in the case where a polysilazane formed in low firing temperature is used for the reinforcement material 306.

Figure 3C:
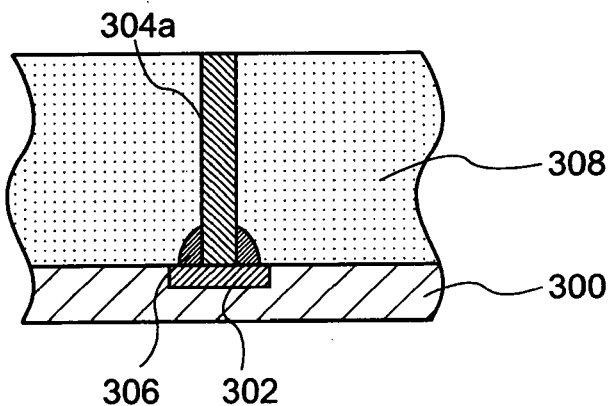

As shown in FIG. 3C, the insulating layerinsulating layer 308 is formed on the substrate 300, so that a tip end part of the columnar structure 304a is exposed.

More specifically, an insulating polymer material or a dielectric material (film-forming material) such as silicon oxide etc., is deposited approximately to the entire substrate 300 including the columnar structure 304a with the spin coating etc.; thereafter, the insulating layerinsulating layer 308 is removed by etching back or by chemical mechanical polishing or the like, so that the tip end part of the columnar structure 304a is exposed.

Figure 3D:
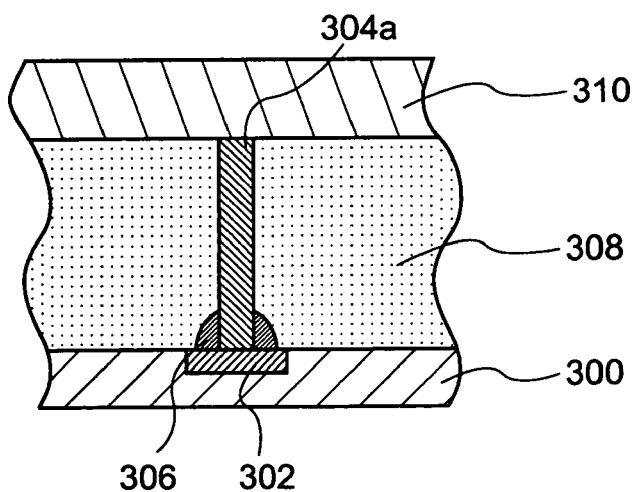

As shown in FIG. 3D, a second conductive layer 310 is formed, in order for it to have a contact with the tip end part of the columnar structure 304a. The second conductive layer 310 can be formed in a similar manner to that of the first conductive layer 302.

According to Embodiment 1, the columnar structure 304a is fixed by the reinforcing material; hence the occurrence of defects caused by the falling of the columnar structure 304a can be reduced, in the case of forming the insulating layerinsulating layer 308 on the substrate 300 that includes the columnar structure 304a. Moreover, the columnar structure 304a is fixed by an external adherence of the reinforcement material 306, thus allowing it to be fixed in a simple process. Consequently, the manufacturing of a product provided with the contact structure is possible with a high yield and with an easy process, which is suitable for mass production.

MODIFIED EXAMPLE

In order to further improve the adherability of the liquid material (the reinforcement material 306), lyophilic processing may be performed to the columnar structure 304a.

Figure 4A:
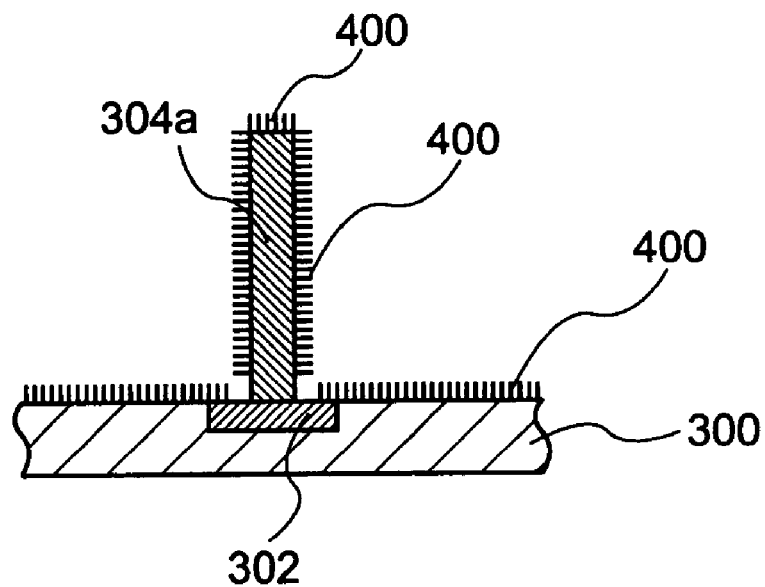
FIG. 4 is a drawing for explaining a process of performing a lyophilic processing to a columnar structure.

Hereafter, the description is specifically made with reference to FIG. 4. FIG. 4 is a drawing for explaining a process of performing a lyophilic processing to a columnar structure.

After the process shown in FIG. 3A mentioned above, a Self Assembled Mono Layer (SAM) 400 is formed, as shown in FIG. 4, on the substrate 300 that includes the columnar structure 304a and the first conductive layer 302.

More specifically, the substrate 300 that includes the columnar structure 304a, composed of the conductive materials such as Au, etc., is dipped into a solution that includes materials that can compose the SAM 400, such as thiols (for example, octathiol or octadecanetiol, etc.) or the like. Here, concentration of solution and dipping duration are not limited specifically, and selected appropriately according to the density of the SAM 400 to be formed. Thereafter, by drying the liquid, the SAM 400 can be formed on the substrate 300 that includes the columnar structure 304a.

Figure 4B:
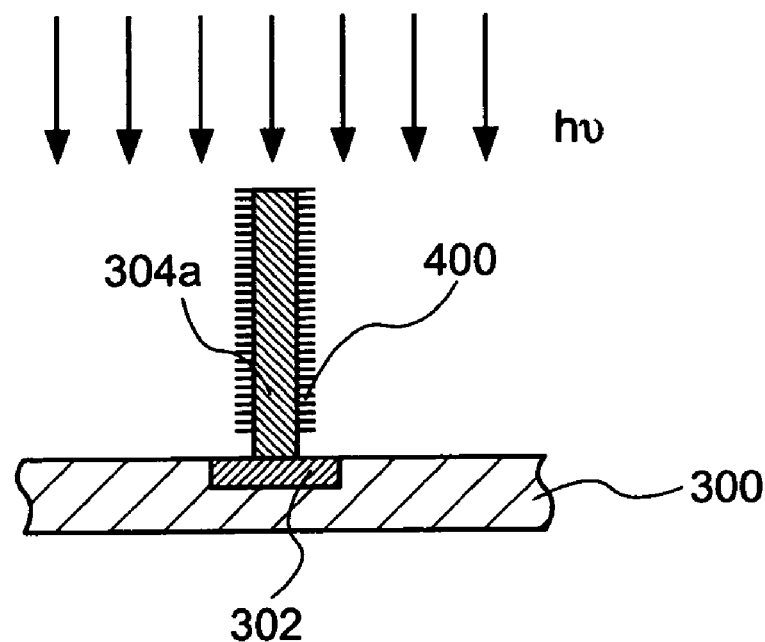

Hereafter, as shown in FIG. 4B, a highly directional UV light is applied vertically to the substrate 300. Consequently, the SAM 400 can be selectively removed except for the side surface of the columnar structure 304a.

Thereafter, the contact structure can be obtained with the similar processes, shown in FIG. 3B and on.

As described, forming the SAM 400 enables the reinforcement 306 to be adhered to the columnar structure 304a selectively and strongly.

In this modified example, the lyophilic property of the columnar structure 304a is increased. However, lyophilic processing is not limited to such a process, and it may also be conducted by roughening the surface of the columnar structure by laser beam radiation, for instance by UV radiation etc.

Embodiment 2

In Embodiment 1, the case, where the columnar structure 304a is composed of the conductive material serving as the contact plug, is explained. On the other hand, in Embodiment 2, the case, where the columnar structure 304a is composed of a removable material such as photoresist etc., is explained.

FIG. 5 is a drawing for explaining a method of manufacturing the contact structure in Embodiment 2.

Figure 5A:
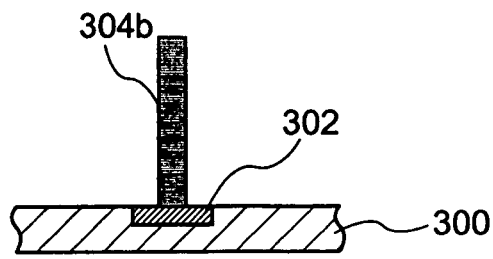
FIG. 5 is a drawing for explaining a method of manufacturing a contact structure in Embodiment 2.

As shown in FIG. 5A, the columnar structure 304b, composed of a material with a different etching rate from that of the later-formed insulating layerinsulating layer 308, is formed on the first conductive layer 302 formed on the substrate 300.

Materials with a different etching rate from that of the insulating layerinsulating layer 308 are not limited specifically. For example, a photoresist may be used. Hereafter, an example, where the photoresist is used as a material with a different etching rate from that of the insulating layerinsulating layer 308, is explained.

The photoresist is formed approximately on the entire surface of the substrate 300 including the first conductive layer 302. Thereafter, exposure and lithography is performed. Consequently, a columnar structure 304b made of the photoresist, is formed at the desired location.

Figure 5B:
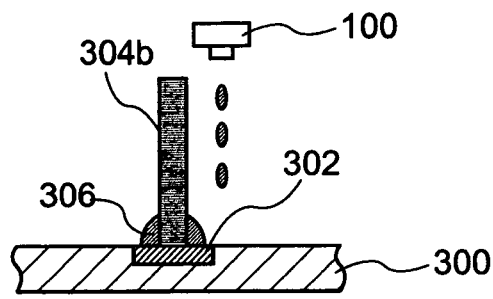

Hereafter, as shown in FIG. 5B, the reinforcement material 306 is adhered to the vicinity of the columnar structure 304b's foot, using the inkjet head 100, thereby fixing the columnar structure 304b.

Here, it is desirable that the reinforcement material 306 be composed of the same material that composes the columnar structure 304b (in this case, photoresist). Consequently, the reinforcement material 306 can be removed simultaneously with the removal of the columnar structure 304b in the later process. Moreover, with such configuration, the contact plug enlarged at the vicinity of its foot is formed; therefore a reliable electric connection with the first conductive layer 302 can be provided, and an alignment precision can be lessened. Further, the reinforcement material 306 is not specifically limited to the above, and may also be composed of, for example, the dielectric material, specifically the same kind of material as that of the insulating layerinsulating layer 308. Consequently, the reinforcement material 306 can be a part of the insulating layerinsulating layer 308, allowing the reinforcement without changing the size of the columnar structure itself; thus providing a high-density wiring.

Figure 5C:
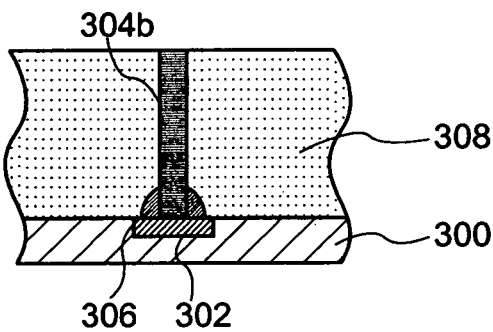

As shown in FIG. 5C, the insulating layerinsulating layer 308 is formed on the substrate 300, so that a tip end part of the columnar structure 304b is exposed.

More specifically, an insulating polymer material or a dielectric material (film-forming material) such as silicon oxide etc., is deposited approximately to the entire substrate 300 including the columnar structure 304b with the spin coating etc.; thereafter, the insulating layerinsulating layer 308 is removed by etching back or by chemical mechanical polishing or the like, so that the tip end part of the columnar structure 304b is exposed. Here, the dielectric material with a larger etching rate than that of the material composing the columnar structure 304b, for example with an etching rate that is 100 to 1000 times larger, is used.

Figure 5D:
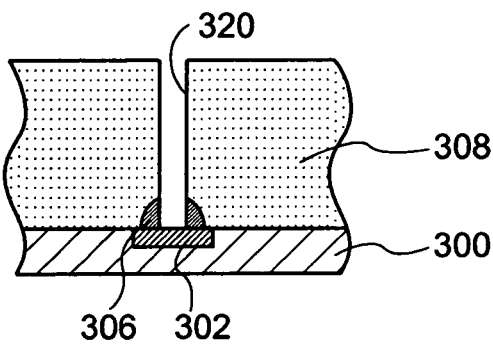

As shown in FIG. 5D, the columnar structure 304b is removed with, for instance, a dry etching method or the like. Consequently, a contact hole 320 is formed.

Figure 5E:
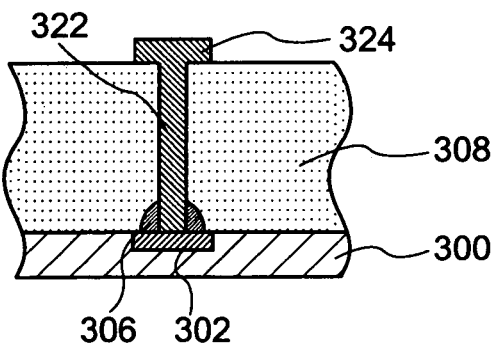

Thereafter, as shown in FIG. 5E, the conductive materials such as Cu, Au, W, etc., are deposited approximately to the entire surface of the substrate 300 including the contact hole 320, and then a patterning is performed; hence a contact plug 322 and a second conductive layer 324 are obtained.

With Embodiment 2, the selection of materials for forming the columnar structure 304b broadens. This is because the columnar structure 304b is used for the columnar structure that serves as a frame to form the contact hole 320, and the material thereof is different from that of the one used for forming the contact plug 322. Further, the conductive material composing the contact plug 322 and the formation method thereof are not limited to materials and formation methods with which the columnar structure can easily be formed. It can be any material and a formation method thereof suitable for electric connection. Hence a further high performance of the structure can be provided.

In the example mentioned above, the case in which the photoresist is used for the columnar structure 304b is described. However, the embodiment shall not be limited to this structure. For instance, silicon oxide may be used as a material to compose the columnar structure 304b, and organic silicon oxide film may be used as the insulating layerinsulating layer 308. In such a case, by using, for example, diluted hydrofluoric acid or the like as an etchant, silicon oxide can be selectively removed.

As described above, the contact structure manufactured by the methods for manufacturing a contact structure in the embodiments of the invention can be suitably utilized in a semiconductor device 500 and a multi-layered wiring 600.

Figure 6A:
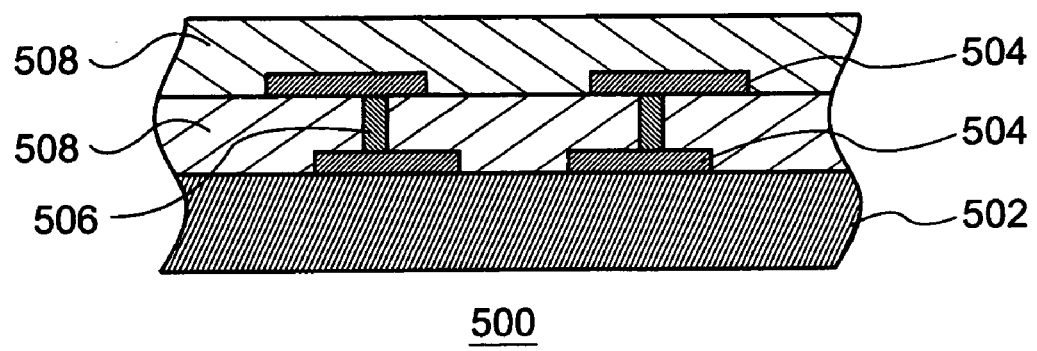
FIG. 6 includes drawings showing examples of a semiconductor device and a multi-layered wiring provided with the contact structure manufactured using methods for manufacturing the contact structure in the invention.
Figure 6B:
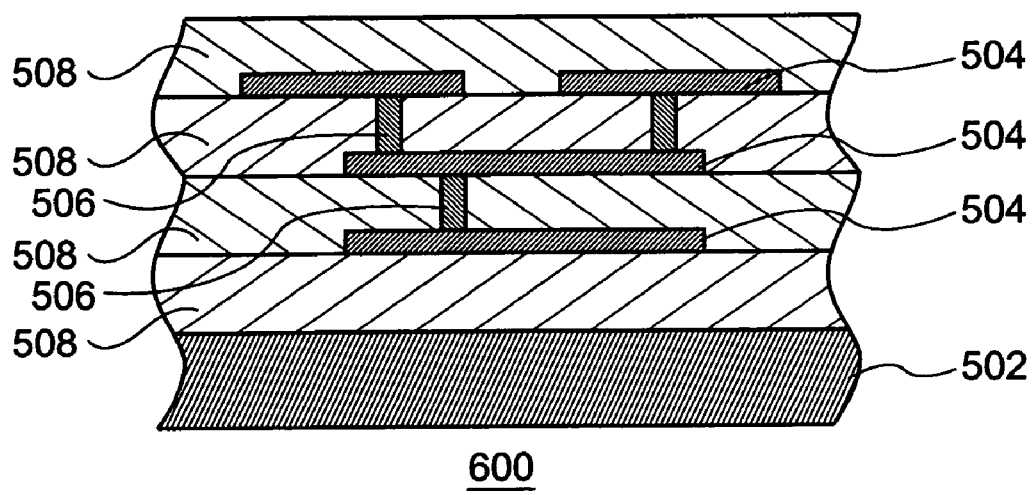

FIG. 6A is a drawing showing an example of the semiconductor device 500, provided with the contact structure, and FIG. 6B is a drawing showing an example of the multi-layered wiring 600, both manufactured using the methods for manufacturing the contact structure in the embodiments of the invention. In FIGS. A and B, numerals 502, 504, 506, and 508 respectively represent a semiconductor substrate, a conductive layer (wiring layer), a contact plug, and a insulating layer.

The semiconductor device 500 and the multi-layered wiring 600 described can be suitably utilized for an electro-optical device provided with the semiconductor device 500 and/or the multi-layered wiring 600. The electro-optical device mentioned here includes an organic electroluminescence (Organic EL) device, a liquid display device, an electrophoresis apparatus, etc.

In FIG. 7, there are drawings showing examples of various electronic apparatus configured including the electro-optical device 700, for instance, the organic EL device.

FIG. 7A indicates an example applied to a mobile phone, in which a mobile phone 830 is provided with an antenna portion 831, a sound output portion 832, a sound input portion 833, an operation portion 834, and the electro-optical device 700 in the embodiments of the invention. FIG. 7B indicates an example applied to a video camera, in which a video camera 840 is provided with a picture portion 841, an operation portion 842, a sound input portion 843, and the electro-optical device 700. FIG. 7C indicates an example applied to a television, in which a television 900 is provided with the electro-optical device 700. Similarly, the electro-optical device 700 can be applied to monitor devices used in personal computers, etc. FIG. 7D indicates an example applied to a roll-up television, in which a roll-up television 910 is provided with the electro-optical device 700.

The electronic apparatus that apply the processing methods (etching methods) in the embodiments of the invention are not limited to the above examples. The processing methods can be applied to methods for manufacturing various electronic apparatus, such as a facsimile device with a display function, a view-finder of a digital camera, a mobile television, an electronic notebook, an electrical bulletin board, a display for advertising, an IC card, a PDA, or the like.

What is claimed is:

1. A substrate having multi-layer wirings, comprising:
    a base material;
    a first conductive layer formed on the base material, the first conductive layer having a top surface including first and second partial surfaces;
    an insulating layer formed on the first conductive layer;
    a second conductive layer formed on the insulating layer; and
    a conductive columnar structure formed in the insulating layer such that the conductive columnar structure contacts the first partial surface and does not contact the second partial surface, the conductive columnar structure connecting the first conductive layer and the second conductive layer,
    wherein only a portion of the second partial surface and a portion of the conductive columnar structure are covered by a reinforcement material.

2. The substrate according to claim 1, the reinforcement material being attached to a connecting portion between the conductive columnar structure and the first conductive layer.

3. The substrate according to claim 1, the reinforcement material including an insulating material.

4. The substrate according to claim 1, the reinforcement material including a conductive material.

5. An electro-optical device having the substrate according to claim 1.

6. An electronic apparatus having the electro-optical device according to claim 5.

7. A method of forming a substrate having multi-layer wirings, comprising:
    forming a first conductive layer on a base material, the first conductive layer having a top surface including first and second partial surfaces;
    forming a columnar structure on the first conductive layer such that the columnar structure contacts the first partial surface and does not contact the second partial surface;
    attaching a reinforcement material to only a portion of the second partial surface and a portion of the columnar structure;

forming an insulating layer on the first conductive layer, the insulating layer surrounding the reinforcement material; and forming a second conductive layer on the insulating layer, a part of the columnar structure being connected to the second conductive layer.

8. The method of forming a substrate according to claim 7, the forming of the reinforcement material including discharging a liquid material from a droplet discharge device, the liquid material including a substance of the reinforcement material.

9. The method of forming a substrate according to claim 7, further comprising:

forming a lyophilic portion at the part of the first conductive layer and the part of the columnar structure before the forming of the reinforcement material.

10. The method of forming a substrate according to claim 9, the forming of the lyophilic portion including forming a self assembled mono layer at the part of the first conductive layer and the part of the columnar structure.

11. The method of forming a substrate according to claim 7, further comprising:

eliminating the columnar structure to form a contact hole after the forming of the insulating film; and filling the contact hole with a conductive material before the forming of the second conductive layer.

12. The method of forming a substrate according to claim 11, a material of the columnar structure and a material of the insulating film being different.

13. A method of forming an electro-optical device having the substrate according to claim 7.

14. A method of forming an electronic apparatus according to claim 13.

* * * * *